(12) United States Patent
Nakamura

(10) Patent No.: US 6,459,282 B1
(45) Date of Patent: Oct. 1, 2002

(54) CHARGED PARTICLE BEAM TEST SYSTEM FOR EXTRACTING TEST RESULT AT SPECIFIED TIMING

(75) Inventor: Takayuki Nakamura, Ohra-gun (JP)

(73) Assignee: Advantest Corp., Tokyo (JP)

( * ) Notice: Subject to any disclaimer, the term of this patent is extended or adjusted under 35 U.S.C. 154(b) by 68 days.

(21) Appl. No.: 09/583,836

(22) Filed: May 31, 2000

Related U.S. Application Data

(63) Continuation of application No. 09/097,122, filed on Jun. 12, 1998, now Pat. No. 6,225,815.

(30) Foreign Application Priority Data

Jun. 12, 1997 (JP) ............................................. 9-154687

(51) Int. Cl.[7] .............................................. G01R 31/28
(52) U.S. Cl. ........................ 324/750; 324/751; 324/765
(58) Field of Search ................................. 324/750, 751, 324/752, 753, 158.1, 73.1, 71.3; 250/310, 311; 356/384; 438/14, 18, 17

(56) References Cited

U.S. PATENT DOCUMENTS 5,185,571 A * 2/1993 Brust ........................ 324/751
5,548,211 A * 8/1996 Tujide et al. ............... 324/750
5,592,099 A * 1/1997 Kuribara et al. ............ 324/751

* cited by examiner

Primary Examiner—Vinh P. Nguyen
(74) Attorney, Agent, or Firm—Muramatsu & Associates

(57) ABSTRACT

A charged particle beam test system identifies a fail signal generated at the predetermined timing for evaluating a semiconductor device under test (DUT). The charged particle beam test system includes a column for irradiating a beam pulse upon the DUT in response to a sampling pulse and detecting secondary electron emitted from the DUT, an IC tester for supplying a test signal to the DUT and comparing an output signal of the DUT with an expected signal and generating fail signals when the output signal fails to match the expected signal, a plurality of fail signal separation circuits for identifying fail signals generated at the specified timings, a gate circuit for defining a combination of the fail signals from the fail signal separation circuits, and a test result memory for storing test result data in response to the fail signals.

4 Claims, 7 Drawing Sheets

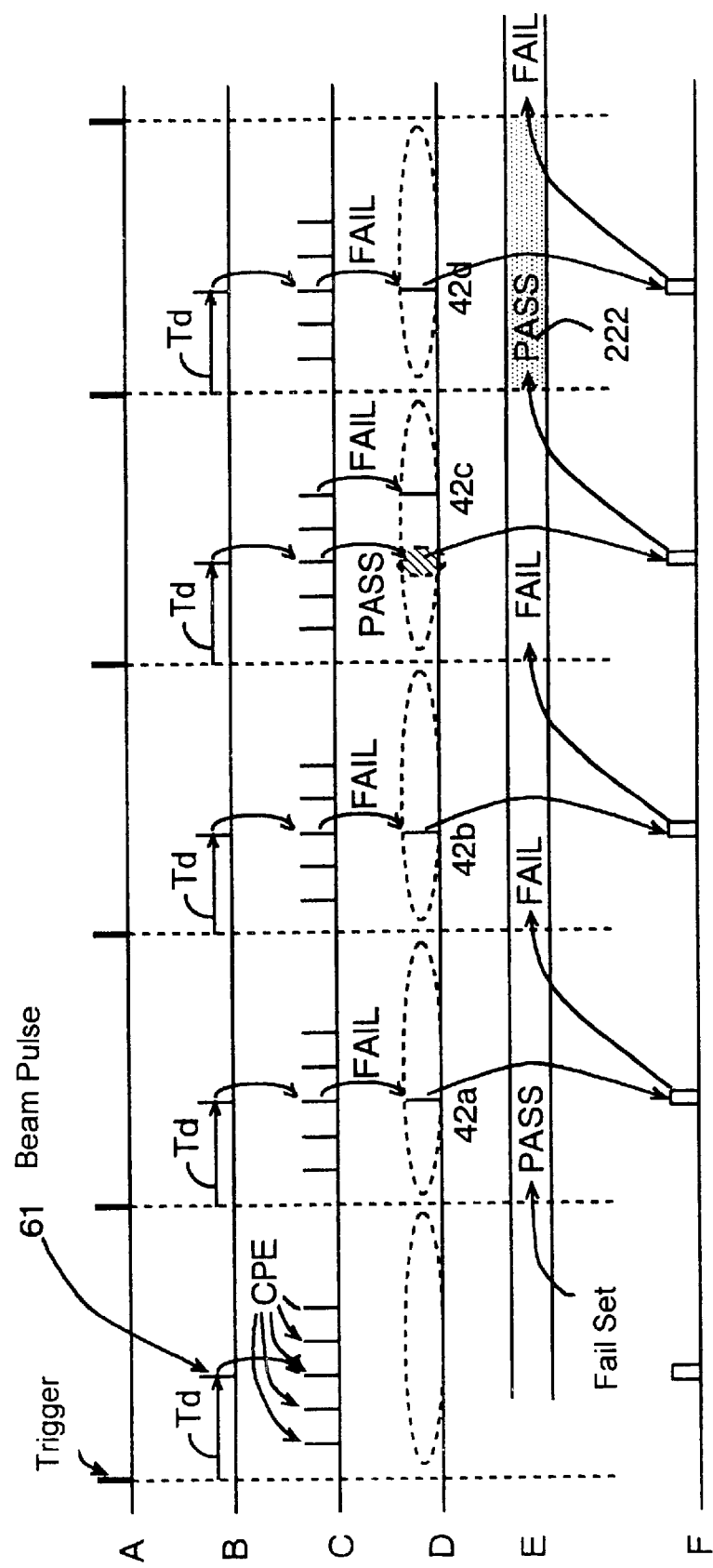

CHARGED PARTICLE BEAM TEST SYSTEM FOR EXTRACTING TEST RESULT AT SPECIFIED TIMING

This is a continuation of U.S. patent application No. 09/097,122, filed on Jun. 12, 1998, now U.S. Pat. No. 6,225,815.

FIELD OF THE INVENTION

This invention relates to a charged particle beam test system for testing an electronics circuit, and more particularly, to a charged particle beam test system for testing a semiconductor integrated circuit by sampling electric potentials on a surface of the integrated circuit with improved accuracy and efficiency.

BACKGROUND OF THE INVENTION

As one of the methods for testing semiconductor devices such as a very large scale integrated circuit (VLSI), a charged particle beam test system may be used to monitor voltages of internal nodes of the VLSI. A charged particle beam, such as an electron beam, is irradiated onto the surface of an integrated circuit under test (DUT) and the resultant secondary electron which represents the voltages and other states of the DUT is detected, thereby obtaining a voltage contrast image of the DUT on a display. A charged particle beam test system is advantageous for testing high density and complex semiconductor chips because it can test such semiconductor chips without physically contacting the chips for probing input/output signals.

In a modern charged particle beam test system, a charged particle beam tester and an IC tester interact with each other to analyze the performance of a DUT. As is well known in the art, an IC tester provides a test pattern signal (also called a test vector) to a DUT and compares the resultant output signal from the DUT with an expected value signal. Such a comparison is made at a timing predetermined by a comparison enable signal provided in a test program. If the output signal from the DUT is different from the expected value signal, the IC tester generates a fail signal.

In a charged particle beam test system having an IC tester, a DUT is placed on an X-Y stage of the charged particle beam column. The DUT is provided with a test pattern signal from the IC tester and the resultant output signal of the DUT is compared with the expected value signal as noted above by the IC tester. At the same time, the specified portion of the DUT which is being tested by the IC tester is also tested by the charged particle beam tester by being irradiated with the charged particle beam and the resultant secondary electron is detected. In this manner, in a charged particle beam test system, test result data is acquired concerning the DUT's output signal produced in response to the test pattern signal as well as concerning the potential contrast of the inner nodes of the DUT relative to the test pattern, resulting in a highly sophisticated and efficient evaluation of the DUT performance.

An example of such a charged particle beam test system in the conventional technology is shown in FIG. 5. FIG. 6 is a timing chart showing the timing relationship between trigger signals, sampling pulses (charged particle beam pulses) and pass/fail signals in the charged particle beam test system of FIG. 5. FIGS. 4A and 4B are schematic diagram showing sampled waveforms relative to the timings of the sampling pulses.

In the example of FIG. 5, the charged particle beam test system is formed with a charged particle beam tester EBT such as an electron beam tester and an IC tester 40. The charged particle beam tester EBT includes a sampling pulse generator 50, a charged particle beam column 60, a signal processor 70, a test result memory 80, and a controller 90. The charged particle beam column 60 includes a charged particle beam generator such as an electron gun 62, a beam blanker 64, and a secondary electron detector 68. At the bottom of the column 60, an X-Y stage 67 is provided to place a semiconductor device under test (DUT) thereon.

A charged particle beam such as an electron beam emitted from the electron gun 62 irradiates the surface of the DUT through the beam blanker 64. The beam blanker 64 controls blanking of the charged particle beam from the electron gun 62 thereby producing a pulsed charged particle beam 61. By moving the X-Y stage 67 in the X and Y directions, the irradiating position of the charged particle beam on the surface of the DUT can be controlled. The signal processor 70 provides a control signal which is provided to the grid 66 to control the amount of secondary electron emitted from the DUT. The secondary electron is detected and integrated by the secondary electron detector 68.

The IC tester 40 provides a test pattern signal 48 with predetermined timings to one or more terminals of the DUT and evaluates the resultant signals from the DUT by comparing the same with the expected value signals. The IC tester 40 also provides a trigger signal 41 to the sampling pulse generator 50 to synchronize the test pattern signal 48 to the DUT with the pulsed charged particle beam 61 irradiated on the DUT. To define the timings of such comparison operations between the DUT's output signal and the expected value signal, the test program used in the IC tester includes several comparator enable (CPE) signals for each time interval between the two trigger signals 41.

The IC tester 40 also sends a fail signal 42 and a clock signal 49 to the charged particle beam tester EBT. The clock signal 49, in this case, is a tester rate clock which defines a test cycle of the IC tester 40. Although not shown in the drawings, a plurality of test cycles are included within each cycle of the trigger signals 41.

In the arrangement of FIG. 5, the IC tester 40 sends the trigger signal 41 to the charged particle beam tester EBT at a predetermined timing relationship with the test pattern signal 48 as shown in FIG. 6A. As noted above, the test program is designed to generate one or more comparator enable signals (CPE) within the trigger cycle as shown in FIG. 6C. Thus, at the timing of the CPE, i.e., for the test cycle having the CPE, the DUT output signal is compared with the expected data signal and a fail signal 42 is generated in the case where the DUT output signal does not match the expected data signal. In the actual test system, the fail signal 42 is produced several cycles later than the test cycle in which the DUT output fails.

The sampling pulse generator 50 includes a delay circuit and generates a sampling pulse 51 at a specified delay time Td after the trigger signal 41 from the IC tester 40. The sampling pulse 51 drives the charged particle beam blanker 64, thus, the column 60 generates the charged particle beam pulse 61 as shown in FIG. 6B. Consequently, the charged particle beam (such as electron beam) pulse 61 is generated at the timing of the sampling pulse 51, which is irradiated on the specified position of the DUT.

In an actual test system, to improve the measurement accuracy, the sampling pulse 51 (beam pulse 61) is repeatedly irradiated on the DUT at the fixed timing Td from the trigger signal 41. For example, the same sampling pulse 51 is repeated by several ten to several thousand times and the data detected by the secondary electron detector 68 is integrated during this period. Namely, the secondary electron detector 68, which is for example, a scintillator or a photomultiplier, converts the detected secondary electron to an electric signal representing the amount of secondary electron and integrates the detected signals for the number of beam pulses supplied to the DUT.

The controller 90 controls the overall process of the charged particle beam tester EBT. For example, the controller 90 sets the delay time Td in the sampling pulse generator 50. After acquiring the number of data for the sampling pulses 51 which is delayed by Td from the trigger signal 41, the controller 90 slightly changes the delay time Td relative to the trigger signal 41 as shown in FIG. 4A to collect the data by repeatedly applying the beam pulse 61 at this timing. By repeating this process while slightly changing the delay time Td, the waveform data such as shown in FIGS. 4A and 4B are acquired and stored in the test result memory 80.

The signal processor receives the trigger signal 41 and the fail signal 42 from the IC tester 40. The signal processor 70 determines that the DUT has failed in the sampling point in question if it receives at least one fail signal 42 before the next trigger signal is received. Based on this pass or fail judgement made by the signal processor 70, the measured data from the secondary electron detector 68 is separately processed and accumulated. The processed measured data 71 separately includes pass potential information (PASS) and fail potential information (FAIL) which is supplied to the test result memory 80.

The signal processor 70 also sends address data to the test result memory 80. The address data is produced based on the trigger signal 41 and the timing relationship between the trigger signal 41 and the delay time Td. In receiving the measured data 71 and the address data, the test result memory 80 stores the pass potential information (PASS) in the PASS memory 82 and the fail potential information (FAIL) in the FAIL memory 84, respectively. Consequently, the potential data of the specified portion of the DUT will be illustrated as a waveform 201 of FIG. 4B.

As noted above, the controller 90 controls the overall process of the charged particle beam tester EBT including the timing shift of the delay time Td. The controller 90 sets various other parameters in the charged particle beam tester EBT as well as communicates with the IC tester to effectively interact with the charged particle beam tester.

In the conventional test system in the foregoing, the plurality of CPE (comparator enable) signals are provided in the test program of the IC tester in each cycle of the trigger signal 41 as shown in FIG. 6. If there is a mismatch between the resultant output signal of the DUT and the expected data, a fail signal will be generated by the IC tester. As noted above, the signal processor 70 determines that the DUT has failed if it receives at least one fail signal 42. Thus, if a fail signal 42 is generated at the timing which is different from the charged beam pulse 61, such as a fail signal 42c in the fourth cycle of FIG. 6D, the signal processor 70 determines that the DUT has failed. Thus, the measured data by the secondary electron detector 68 is recorded in the test result memory as the fail potential information. This fail information is incorrect because the DUT response evaluated by the IC tester at the time when the charged particle beam pulse 61 is actually supplied to the DUT shown in FIG. 6B matches the expected data, i.e., "PASS" as shown in FIG. 6D.

Therefore, in the conventional charged particle beam test system, if a fail signal is generated by the IC tester at the timing other than the irradiation of the charged particle beam pulse 61 upon the DUT, there arises an inconsistency between the measured data by the charged particle beam tester EBT and the pass/fail information by the IC tester. In the above example where the fail signal 42c is generated in the fourth cycle of the trigger signal, the measured data must be treated as pass potential information instead of fail potential information. In such a situation, it is not possible to observe a correct potential image such as a waveform 201 but may obtain an incorrect image such as a waveform 202 of FIG. 4B.

If the device test program is modified to generate only one comparator enable (CPE) at the timing of the sampling pulse, i.e., charged particle beam pulse 61, such an inconsistency of measured data may be avoidable. However, this solution has a disadvantage in that many device programs must be prepared for acquiring the data in the different sampling timings such as when the delay time Td relative to the trigger signal 41 is changed.

SUMMARY OF THE INVENTION

Therefore, it is an object of the present invention to provide a charged particle beam test system which is capable of acquiring test data correctly representing the voltage of a device under test (DUT) at the timing when the charged particle beam pulse is irradiated on the DUT.

It is another object of the present invention to provide a charged particle beam test system which is capable of separating a fail signal produced at the timing when the charged particle beam pulse is irradiated on the DUT from fail signals produced at other timings.

It is a further object of the present invention to provide a charged particle beam test system which is capable of using a device program having a plurality of comparator enable signals between two trigger signals generated by the IC tester and specifying a fail signal generated only at the specified timing of the comparator enable signal.

It is a further object of the present invention to provide a charged particle beam test system which is capable of separating a plurality of fail signals of predetermined timings and storing the measured data at the timing wherein a specified combination of the fail signals is reached.

In the present invention, the charged particle beam test system is so arranged to identify a fail signal generated at the predetermined timing for evaluating a semiconductor device under test (DUT). The charged particle beam test system includes a charged particle beam column for irradiating a charged particle beam pulse upon a predetermined location of the DUT and detecting secondary electron emitted therefrom representing a voltage of the irradiated location of the DUT, an IC tester for supplying a test signal to the DUT to cause the voltage at the irradiation portion and generating a trigger signal with a predetermined timing relationship with the test signal and comparing an output signal of the DUT with an expected signal and generating fail signals when output signal fails to match the expected signal at timings defined by comparator enable signals, a sampling pulse generator for generating a sampling pulse for driving the charged particle beam column at a predetermined time after the trigger pulse from the IC tester so that the secondary electron is emitted from the DUT in response to the sampling pulse, a fail signal separation circuit for identifying a fail signal from the IC tester which is generated at the specified timing, and a test result memory for storing measured data from the charged particle beam column representing an amount of secondary electron emitted from the DUT when the fail signal is received from the fail signal separation circuit.

In another aspect of the present invention, a plurality of fail signal separation circuits are included in the charged particle beam test system. The fail signals separated by the separation circuits are provided to a matrix (gate circuit) in which a predetermined combination of the fail signals is defined. When the fail signals match the predetermined combination defined in the matrix, a fail detection signal is provided to the test result memory to store the measured data from the charged particle beam column.

BRIEF DESCRIPTION OR THE DRAWINGS

FIG. 3 is a timing chart showing the operation of the charged particle beam test system of the present invention.

DETAILED DESCRIPTION OF THE PREFERRED EMBODIMENTS

Figure 1:
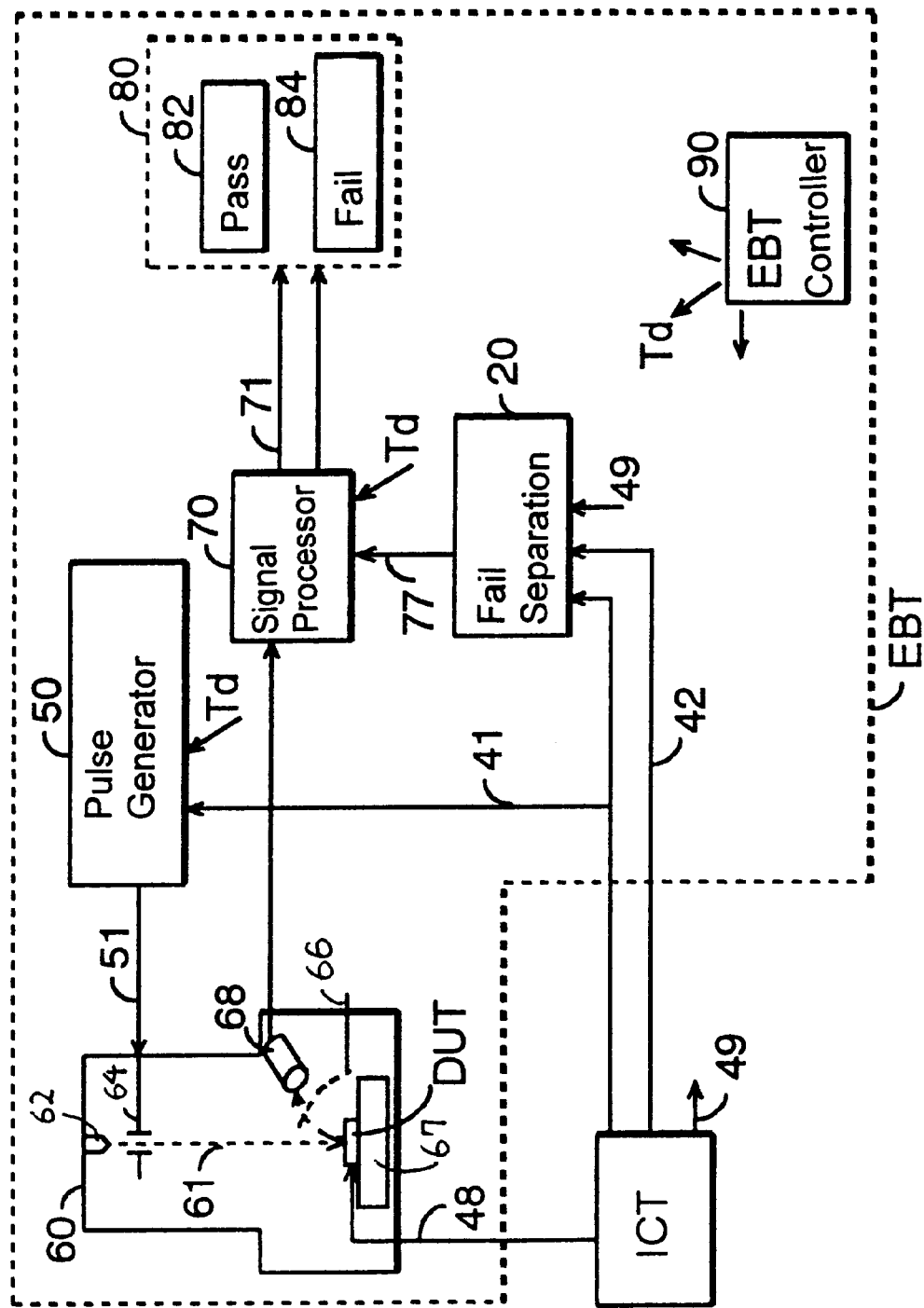
FIG. 1 is a schematic block diagram showing a structure of the first embodiment of the charged particle beam test system of the present invention.
Figure 2:
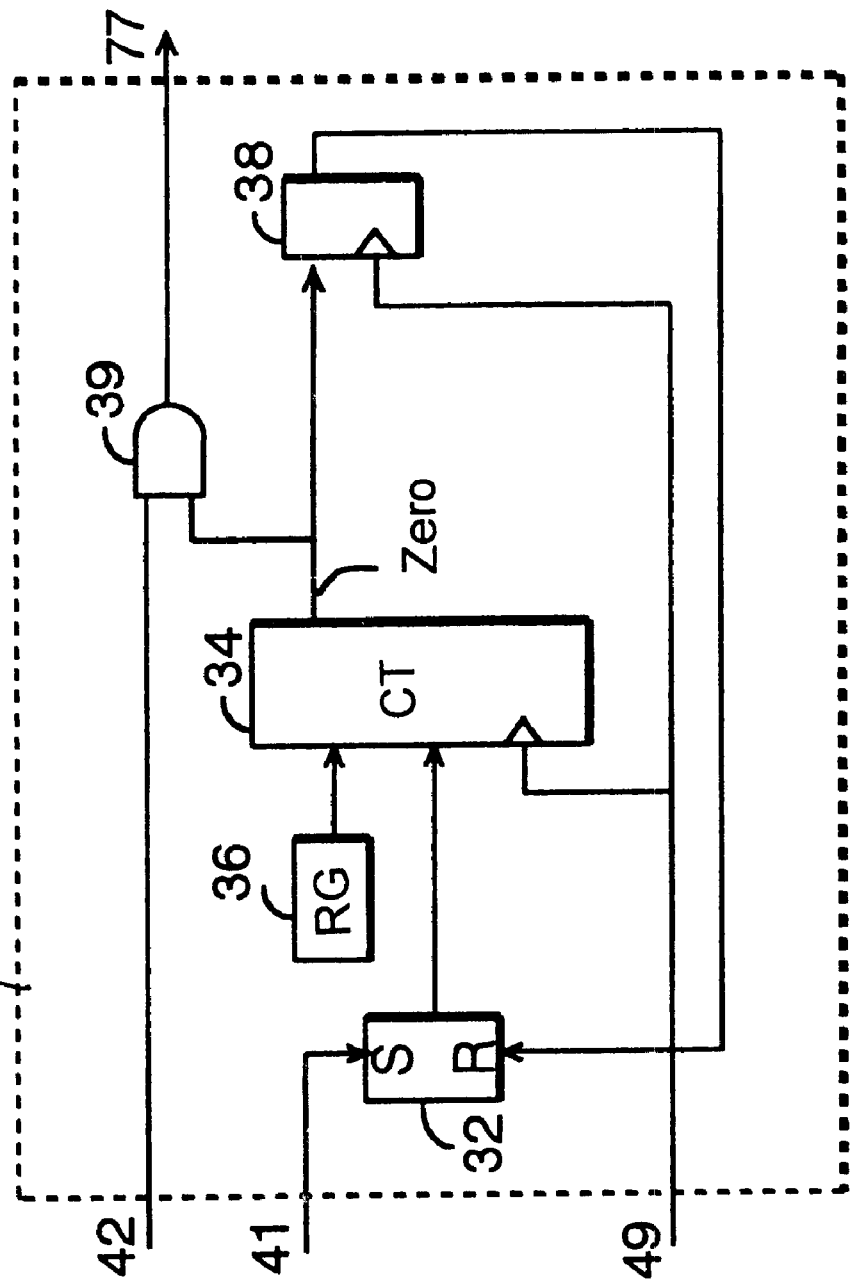
FIG. 2 is a block diagram showing a structure of the fail signal separation circuit of the present invention.
Figure 4A:
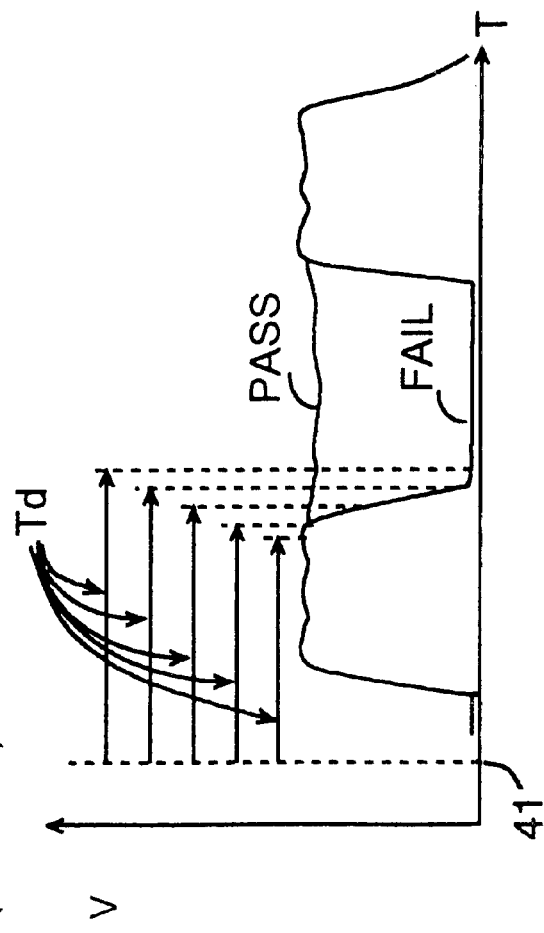
FIGS. 4A and 4B are schematic diagrams showing waveforms of device output signals and plotted waveforms derived from the measured data obtained by the conventional charged particle beam test system.
Figure 4B:
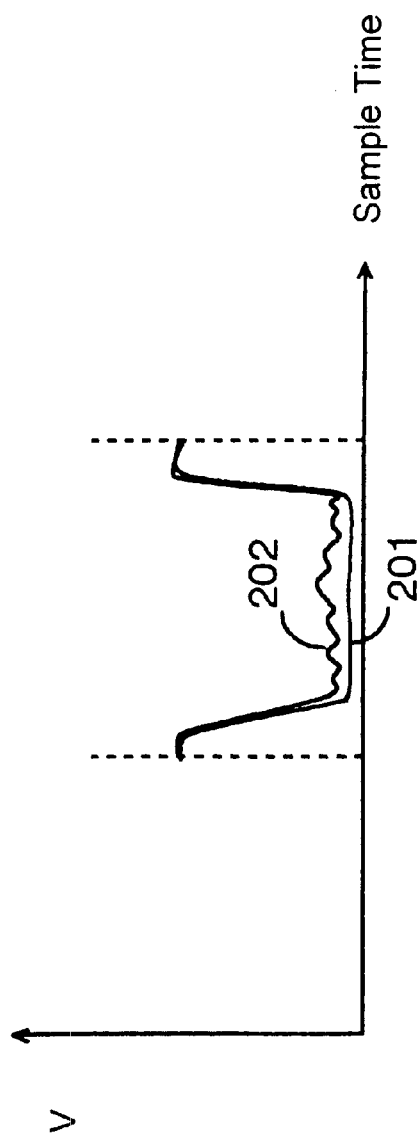

A first embodiment of the present invention is described with reference to FIGS. 1–3. FIG. 1 is a schematic block diagram showing a structure of the charged particle beam test system in the first embodiment of the present invention. FIG. 2 is a block diagram showing a structure of the fail signal separation circuit used in the charged particle beam test system of FIG. 1. FIG. 3 is a timing chart showing the operation of the charged particle beam test system of the present invention of FIG. 1.

Figure 5:
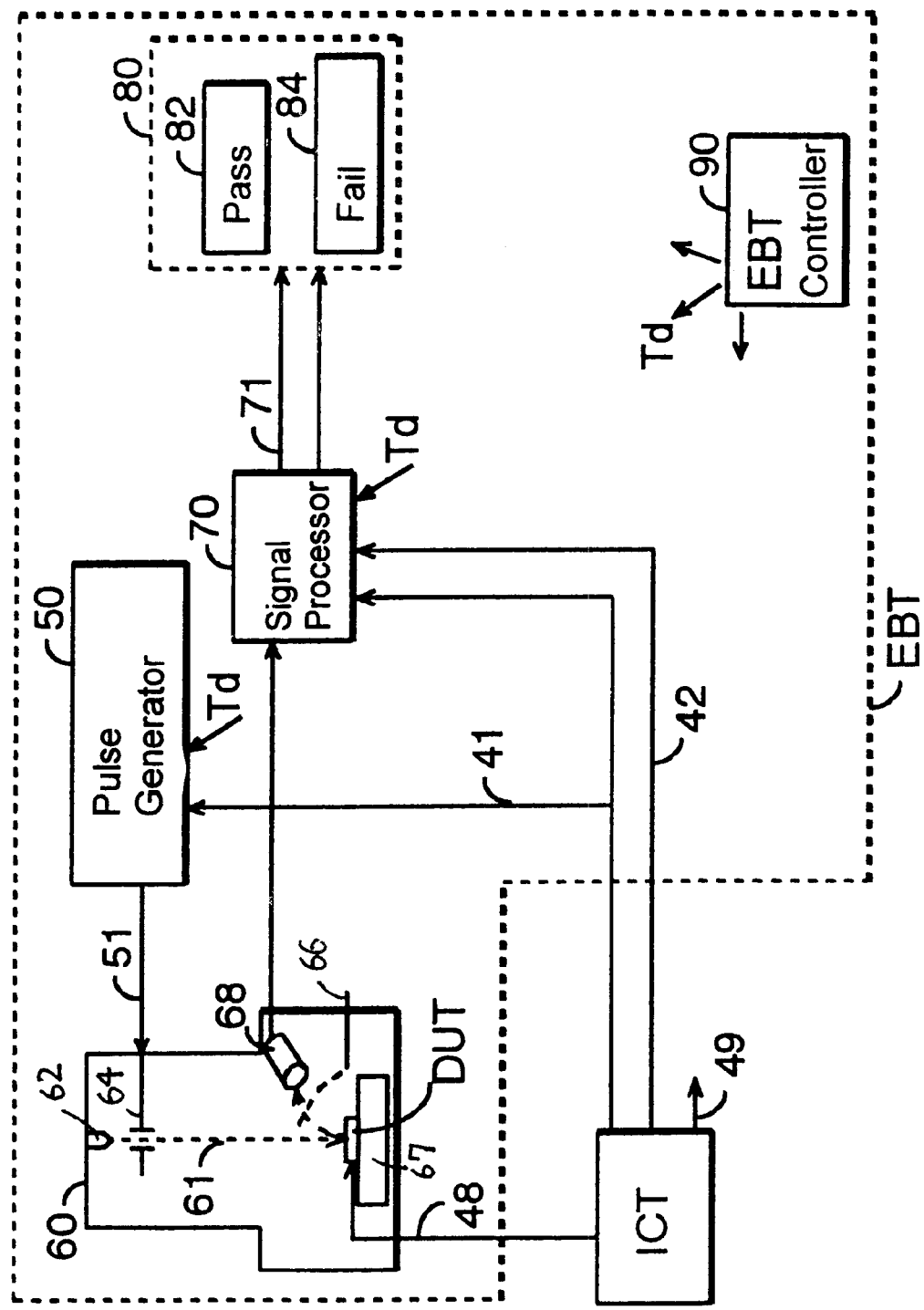
FIG. 5 is a schematic block diagram showing a structure of the charged particle beam test system in the conventional technology.
Figure 6:
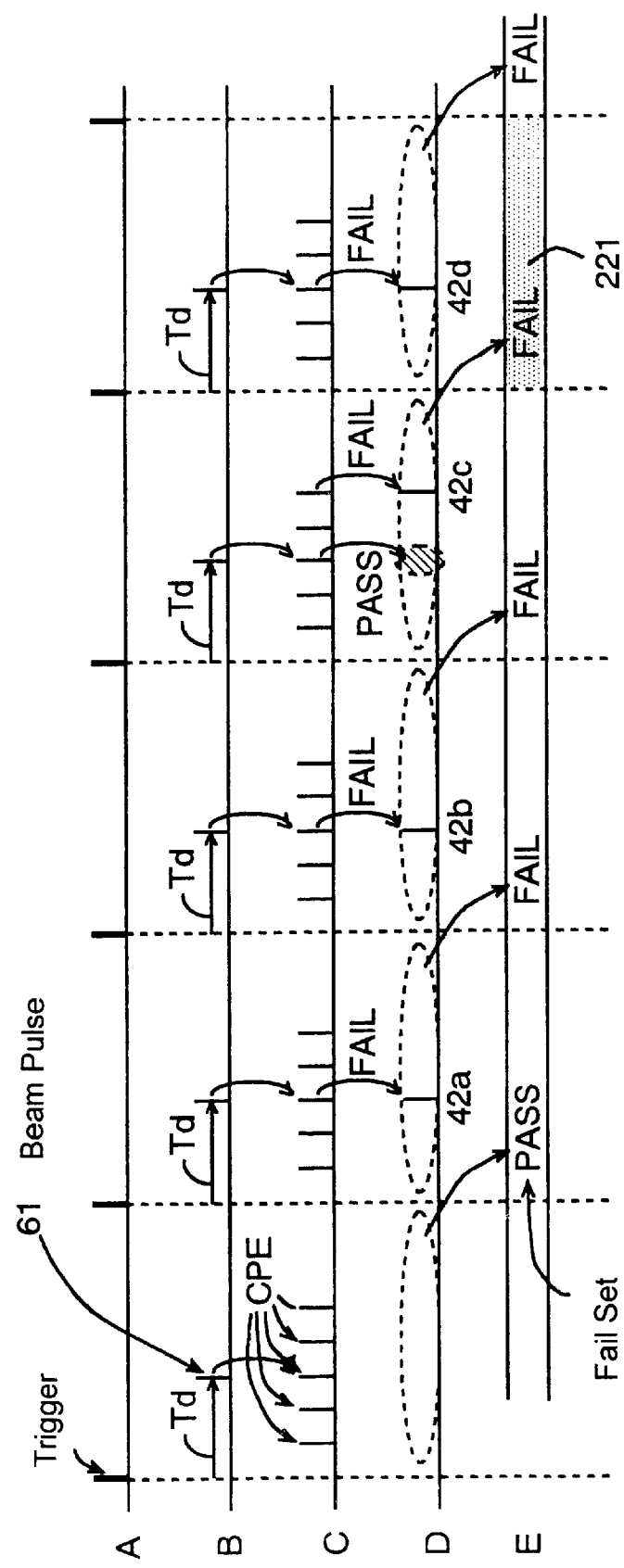
FIG. 6 is a timing chart showing the operation of the conventional charged particle beam test system.

The charged particle beam test system of the present invention includes an IC tester 40, a sampling pulse generator 30, a charged particle beam column 60, a signal processor 70, a test result memory 80, a fail signal separation circuit 20 and a controller 90. Basic difference from the conventional example of FIG. 5 resides in the function and structure of the fail signal separation circuit 20 for specifying the fail signal provided from the IC tester 40 at the predetermined timing.

The fail signal separation circuit 20 is to specify the fail signal from the IC tester 40 generated only at the same timing of the charged particle beam pulse 61 irradiated on the DUT and transmit the same to the signal processor 70. In the example of FIG. 2, the fail signal separation circuit 20 consists of an SR flip-flop 32, a down counter (CT) 34, a register (RG) 36, a flip-flop 38 and a gate 39. A trigger signal 41 to the sampling pulse generator 50 is also provided to the set terminal S of the SR flip-flop 32. A clock signal 49, which is a tester rate clock defining a test cycle of the IC tester 40, is provided to the down counter 34 and the flip-flop 38. A fail signal 42 from the IC tester 40 is supplied to the input of the gate 39.

The SR flip-flop 32 is set by the trigger signal 41 and reset by an output signal of the flip-flop 38. Based on an output signal of the SR flip-flop 32, the down counter 34 loads the data in the register 36 and counts down the clock signal 49. The data stored in the register 36 is produced based on the predetermined delay time Td which is a time difference between the trigger signal 41 and the pulsed beam 61 as shown in FIG. 3 such that the counter 34 reaches zero at the timing of the occurrence of the pulsed beam, i.e., the intended fail signal 42. In other words, the specified value is preset in the down counter 34 to generate a zero signal for detecting the intended fail signal 42 which is in the same timing of the pulsed beam 61.

The zero signal shown in FIG. 3F from the down counter 34 opens the gate 39 to allow the fail signal 42 generated only at this timing to pass therethrough. A resultant fail signal 77 from the gate 39 is thus received by the signal processor 70. The SR flip-flop 32 is reset to an initial state by the output signal of the flip-flop 38 which is in synchronism with the clock signal 49.

Because of this arrangement of the present invention, as shown in the fourth cycle of FIG. 3D, even though the fail signal 42c is generated within the cycle between the two adjacent trigger signals 41, the fail signal 42c is treated as ineffective since it is not in the same timing as that of the pulsed beam 61 of FIG. 3B. Accordingly, the fail signal 42c is unable to reach the signal processor 70, and thus the test result is recognized as PASS in the next cycle as shown in FIG. 3E. The test result 71 from the signal processor 70 (based on the secondary electron detector 68) is stored in the PASS memory 82.

Therefore, in the charged particle beam test system of the present invention, a fail signal generated by the IC tester at the timing other than the irradiation of the charged particle beam pulse 61 is not received by the test result memory 80. Thus, no inconsistency arises between the measured data by the charged particle beam tester EBT and the pass/fail information by the IC tester 40. In the present invention, the device test program having a plurality of comparator enable (CPE) signals within the cycle between the two trigger signals 41 such as shown in FIG. 3C can be used without modification. In measuring the voltage of the DUT in the different timing Td of the charged particle beam pulse 61 relative to the trigger signal 41, data representing such a different timing can be supplied to the register 36.

In the embodiment of FIG. 1, the test result memory 80 includes both the PASS memory 82 and the FAIL memory 84 to separately store the measured data in response to whether the fail signal is received from the IC tester 40. However, in the case where only the fail information is sufficient in a failure analysis process of the DUT, the PASS memory 82 and its associated circuit components can be eliminated.

In the foregoing example of the present invention, the fail signal separation circuit 20 allows only the fail signal at the same timing as the pulsed beam 61 to be transmitted to the test result memory 80. However, it is also possible to detect the fail signal generated at a specified timing which is different from that of the pulsed beam 61 and transmit the same to the test result memory 80 through the signal processor 70. This arrangement is useful in such a case where the DUT response in the timing different from the pulsed beam 61 is desired to be analyzed by the test system.

Figure 7:
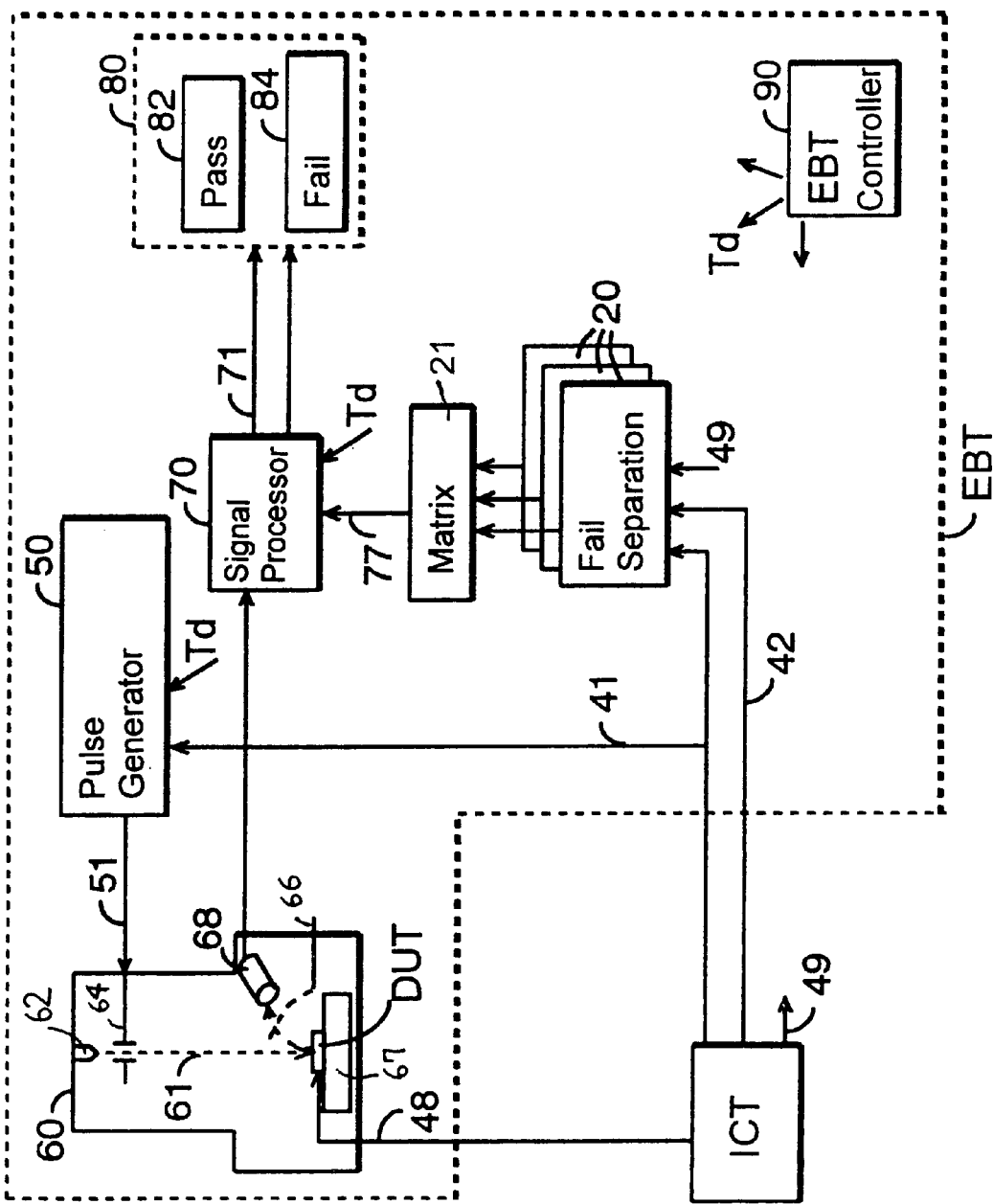
FIG. 7 is a schematic block diagram showing a structure of the second embodiment of the charged particle beam test system of the present invention.

FIG. 7 shows an example which has a plurality of fail signal separation circuits 20 in the charged particle beam test system of the present invention. In the arrangement of FIG.

7, fail signals detected by the separation circuits 20 are provided to a matrix 21 (gate circuit, for example, a plurality of AND gates) where a predetermined combination of the fail signals is defined. When the fail signals match the predetermined combination defined in the matrix (gate circuit) 21, a fail detection signal 77 is provided to the signal processor 70 to store the measured data from the charged particle beam column 60 in the test result memory 80.

The charged particle beam column 60 in the foregoing example can be an electron beam column or an ion beam column or other system which is able to irradiate the charged beam on the DUT and detect the resultant secondary electron.

According to the present invention, the charged particle beam test system is capable of acquiring test data correctly representing the voltage of a device under test (DUT) at the timing when the charged particle beam pulse is irradiated on the DUT. Thus, the charged particle beam test system can use a device program having a plurality of comparator enable signals within a trigger cycle between two trigger signals generated by the IC tester and specify a fail signal generated only at the specified timing of the comparator enable signal. Further, the charged particle beam test system is capable of separating a plurality of fail signals of predetermined timings and storing the measured data at the timing wherein a specified combination of the fail signals is reached.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A charged particle beam test system for evaluating a semiconductor device under test (DUT), comprising:

a charged particle beam column for irradiating a charged particle beam pulse upon a predetermined location of said DUT and detecting secondary electron emitted therefrom representing a voltage of the irradiated location of said DUT;

an IC tester for supplying a test signal to said DUT to cause said voltage at said irradiation portion and generating a trigger signal with a predetermined timing relationship with said test signal, said IC tester comparing an output signal of said DUT with an expected signal and generating fail signals when the output signal fails to match said expected signal at timings defined by comparator enable (CPE) signals;

a sampling pulse generator for generating a sampling pulse upon receiving said trigger signal from said IC tester for driving said charged particle beam column at a predetermined time after said trigger pulse so that said secondary electron is emitted from said DUT in response to said sampling pulse;

a plurality of fail signal separation circuits for identifying a plurality of fail signals from said IC tester generated at specified timings;

a gate circuit for defining a combination of said fail signals from said fail signal separation circuits and generating a fail detection signal when a predetermined combination of said fail signals is reached; and a test result memory for storing measured data from said charged particle beam column in response to said fail signals.

2. A charged particle beam test system as defined in claim 1, wherein each of said fail signal separation circuits comprising:

means for specifying a fail signal timing which is a time length between said trigger signal from said IC tester and said charged particle beam pulse generated by said charged particle beam column; and means for separating a fail signal from said IC tester at said fail signal timing from other fail signals and transferring said separated fail signal to said test result memory.

3. A charged particle beam test system as defined in claim 1, wherein each of said fail signal separation circuits comprising:

a register for storing data representing a time length between said trigger signal from said IC tester and said charged particle beam pulse generated by said charged particle beam column;

a flip-flop which is set by said trigger signal from said IC tester;

a counter for down-counting a clock signal relative to said data received from said register when receiving an output signal from said flip-flop; and a gate for transmitting a fail signal from said IC tester when receiving an output signal from said counter.

4. A charged particle beam test system as defined in claim 1, wherein said test result memory includes a pass memory for storing said measured data from said charged particle beam column when said fail signal is absent and a fail memory for storing said measured data from said charged particle beam column when said fail signal is present.

* * * * *